(12) United States Patent
Hsu

(10) Patent No.: US 8,058,566 B2
(45) Date of Patent: Nov. 15, 2011

(54) PACKAGING SUBSTRATE STRUCTURE AND MANUFACTURING METHOD THEREOF

(75) Inventor: Shih-Ping Hsu, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 793 days.

(21) Appl. No.: 12/163,579

(22) Filed: Jun. 27, 2008

(65) Prior Publication Data
US 2009/0000813 A1  Jan. 1, 2009

(30) Foreign Application Priority Data
Jun. 29, 2007 (TW) ............................... 96123666 A

(51) Int. Cl.
*H05K 1/00* (2006.01)
*H05K 3/42* (2006.01)
(52) U.S. Cl. ............................ 174/262; 29/852; 361/748
(58) Field of Classification Search .................. 174/262; 29/852; 361/748
See application file for complete search history.

(56) References Cited

U.S. PATENT DOCUMENTS

| | | | | |
|---|---|---|---|---|
| 5,869,880 | A * | 2/1999 | Grill et al. ........................ | 257/522 |
| 6,562,657 | B1 * | 5/2003 | Lin .................................. | 438/113 |
| 7,050,304 | B2 * | 5/2006 | Hsu et al. ........................ | 361/719 |
| 7,239,525 | B2 * | 7/2007 | Hsu .................................. | 361/763 |
| 7,242,092 | B2 * | 7/2007 | Hsu .................................. | 257/723 |
| 7,539,022 | B2 * | 5/2009 | Hsu .................................. | 361/763 |
| 7,592,706 | B2 * | 9/2009 | Hsu .................................. | 257/777 |
| 7,656,040 | B2 * | 2/2010 | Hsu et al. ........................ | 257/777 |
| 2002/0189853 | A1 * | 12/2002 | Hsu .................................. | 174/252 |
| 2006/0043549 | A1 * | 3/2006 | Hsu .................................. | 257/678 |
| 2006/0060557 | A1 * | 3/2006 | Sreenivasan et al. ........... | 216/11 |
| 2007/0045784 | A1 * | 3/2007 | Corisis et al. .................. | 257/666 |
| 2007/0246744 | A1 * | 10/2007 | Chen et al. ..................... | 257/211 |
| 2008/0185704 | A1 * | 8/2008 | Hsu et al. ........................ | 257/690 |

FOREIGN PATENT DOCUMENTS

| | | | | |
|---|---|---|---|---|
| JP | 2005064498 A | * | 3/2005 | |
| JP | 2007214534 A | * | 8/2007 | |

* cited by examiner

*Primary Examiner* — Anatoly Vortman
(74) *Attorney, Agent, or Firm* — Schmeiser Olsen & Watts LLP

(57) ABSTRACT

A packaging substrate structure includes a dielectric layer with a plurality of dielectric pillars disposed on a portion of a large-dimension opening area of the dielectric layer; and a first circuit layer with a plurality of first circuits disposed on a portion of the dielectric layer, and a conductive block disposed in the large-dimension opening area of the dielectric layer having the dielectric pillars. The dielectric pillars reduce the difference of the electrical current density distribution between the large-dimension opening area and small-dimension opening areas during electroplating, thereby overcoming the conventional drawback of insufficient thickness or a hollow center of the conductive block that results in an uneven thickness of the circuit layer. The invention further provides a method of manufacturing the packaging substrate structure.

14 Claims, 6 Drawing Sheets

PACKAGING SUBSTRATE STRUCTURE AND MANUFACTURING METHOD THEREOF

BACKGROUND OF THE INVENTION

1. Field of the Invention

The present invention relates generally to a packaging substrate structure and a manufacturing method thereof, and more particularly, to a packaging substrate structure, circuit layer of which has a large-dimension conductive block, and a manufacturing method of the packaging substrate structure.

2. Description of Related Art

Owing to the flourishing development of the electronics industry, the research and development of electronic products have a trend toward multi-function, high-performance products. To satisfy the packaging requirements of high integration and miniaturization for semiconductor packages, multi-layer packaging substrates are developed, wherein dielectric layers and circuit layers are formed on the surface of a core substrate, and conductive vias are formed in the dielectric layers for electrical connection between the circuit layers.

Besides general circuits, circuits of a multi-layer packaging substrate can further comprise a large-dimension conductive block for power connection or ground connection. FIGS. 1A to 1F show a manufacturing method of such a multi-layer packaging substrate.

As shown in FIG. 1A, a carrier layer 10 having a plurality of circuits 101 and electrical connection terminals 102, 102' disposed on the surface thereof is provided. The carrier layer 10 is one of a core board and a dielectric layer of a multi-layer packaging substrate.

As shown in FIG. 1B, a dielectric layer 11 is formed on the surfaces of the carrier layer 10, the circuit layer 101 and the electrical connection terminals 102, 102'. A plurality of first vias 110, 110' are formed in the dielectric layer 11 to expose surfaces of the electrical connection terminals 102, 102'.

As shown in FIG. 1C, a conductive seed layer 13 is formed on the dielectric layer 11.

As shown in FIG. 1D, a resist layer 14 is formed on the conductive seed layer 13, and a plurality of small-dimension opening areas 140 and a large-dimension opening area 140' are formed in the resist layer 14 to expose a portion of the conductive seed layer 13 on the dielectric layer 11 and to expose the electrical connection terminals 102, 102'.

As shown in FIG. 1E, a first circuit layer 15 is formed through an electroplating process that uses the conductive seed layer 13 as a current conductive path, wherein the first circuit layer 15 comprises first conductive vias 151, 151' formed in the first vias 110, 110', first circuits 152 and a large-dimension conductive block 152' formed in the areas 140, 140' of the resist layer 14.

As shown in FIGS. 1F and 1F', the resist layer 14 and the conductive seed layer 13 are removed to expose the first circuits 152 and the conductive block 152'.

However, during formation of the large-dimension conductive block 152' by electroplating, as the electrical current density of the large-dimension conductive block 152' is smaller than that of the small-dimension first circuits 152, thickness of the conductive block 152' can be insufficient and there is a difference e between the thickness of the first circuits 152 and that of the conductive block 152', and even a hollow center 153 can be formed. Thus, the entire thickness of the first circuit layer 15 becomes uneven. As a result, the dielectric layer of the subsequent formed built-up circuit can have an uneven thickness, which makes the via processing rather difficult and accordingly leads to poor electrical connection and poor impedance control.

Therefore, there is a need to provide a manufacturing method of a circuit layer with a large-dimension conductive block so as to prevent uneven thickness or a hollow center of conductive block caused by the difference of electrical current density distribution between large-dimension and small-dimension opening areas during electroplating.

SUMMARY OF THE INVENTION

According to the above drawbacks, an objective of the present invention is to provide a packaging substrate structure and a manufacturing method thereof so as to prevent the conventional drawback of insufficient thickness or a hollow center of a large-dimension conductive block that results in an uneven thickness of the circuit layer.

Another objective of the present invention is to provide a packaging substrate structure and a manufacturing method thereof so as to facilitate a subsequent circuit built-up process and via processing and prevent poor electrical connection and poor impedance control.

In order to attain the above and other objectives, the present invention provides a manufacturing method of a packaging substrate structure, which comprises: providing a carrier layer with a patterned circuit layer disposed on at least a surface thereof, the patterned circuit layer having a plurality of circuits and a plurality of first electrical connection terminals; forming at least a first dielectric layer on the patterned circuit layer and the at least a surface of the carrier layer, and forming a plurality of first vias in the first dielectric layer to expose surfaces of the first electrical connection terminals; forming a second dielectric layer on the first dielectric layer, defining a plurality of small-dimension opening areas and at least a large-dimension opening area in the second dielectric layer, allowing a portion of the first dielectric layer to be exposed from the opening areas and a portion of the opening areas to correspond in position to the first vias, wherein a plurality of dielectric pillars are formed on the first dielectric layer exposed from the large-dimension opening area; forming a conductive seed layer on the second dielectric layer and in the opening areas thereof, in the first vias of the first dielectric layer, and on the surfaces of the first electrical connection terminals exposed from the first vias; forming a resist layer on the conductive seed layer, and forming opening areas in the resist layer to expose a portion of the conductive seed layer, wherein the opening areas of the resist layer correspond in position to the opening areas of the second dielectric layer; forming a first circuit layer by electroplating, wherein the first circuit layer comprises first conductive vias formed in the first vias and electrically connecting to the first electrical connection terminals, first circuits formed on the first dielectric layer exposed from the small-dimension opening areas, and at least a conductive block formed on the first dielectric layer exposed from the large-dimension opening area, the top surfaces of the dielectric pillars being embedded in the conductive block; and removing the resist layer and the conductive seed layer covered thereby.

Therein, the carrier layer is one of a core board and a dielectric layer of a multi-layer packaging substrate.

The above-described manufacturing method further comprises forming a circuit built-up structure on the surfaces of the second dielectric layer and the first circuit layer, wherein the circuit built-up structure comprises at least a built-up dielectric layer, at least a second circuit layer, and a plurality of second conductive vias electrically connecting the second circuit layer and the first circuit layer, the outermost second circuit layer having a plurality of second electrical connection terminals.

The above-described manufacturing method further comprises forming a solder mask layer on the circuit built-up structure, forming a plurality of openings in the solder mask layer, and allowing the second electrical connection terminals of the circuit built-up structure to be exposed from the openings.

The prevent invention provides another manufacturing method of a packaging substrate structure, which comprises: providing a carrier layer with a patterned circuit layer disposed on the surface thereof, the patterned circuit layer having a plurality of circuits and a plurality of first electrical connection terminals; forming a first dielectric layer on the surfaces of the carrier layer and the patterned circuit layer, and forming a plurality of first vias in the first dielectric layer to expose surfaces of the first electrical connection terminals; forming a second dielectric layer on the first dielectric layer, wherein a plurality of small-dimension opening areas and at least a large-dimension opening area are formed in the second dielectric layer so as to expose a portion of the first dielectric layer, with a portion of the opening areas corresponding in position to the first vias, and a plurality of dielectric pillars are formed on the first dielectric layer exposed from the large-dimension opening area; forming a conductive seed layer on the surfaces of the second dielectric layer and in the opening areas thereof, in the first vias of the first dielectric layer, and on the surfaces of the first electrical connection terminals exposed from the first vias; forming a metal layer on the conductive seed layer by electroplating; and removing the conductive seed layer and the metal layer thereon from the second dielectric layer so as to form a first circuit layer, wherein the first circuit layer comprises first conductive vias formed in the first vias and electrically connected to the first electrical connection terminals, first circuits formed on the surface of the first dielectric layer exposed from the small-dimension opening areas, and at least a conductive block formed on the first dielectric layer exposed from the large-dimension opening area, the top surfaces of the dielectric pillars being exposed from the conductive block.

Therein, the carrier layer is one of a core board and a dielectric layer of a multi-layer packaging substrate.

The above-described manufacturing method further comprises forming a circuit built-up structure on the surfaces of the second dielectric layer and the first circuit layer, wherein the circuit built-up structure comprises at least a built-up dielectric layer, at least a second circuit layer, and a plurality of second conductive vias electrically connecting the second circuit layer and the first circuit layer, the outermost second circuit layer having a plurality of second electrical connection terminals.

The above-described manufacturing method further comprises forming a solder mask layer on the circuit built-up structure, forming a plurality of openings in the solder mask layer, and allowing the second electrical connection terminals of the circuit built-up structure to be exposed from the openings.

The present invention further provides a packaging substrate structure, which comprises: a carrier layer with a patterned circuit layer disposed on the surface thereof, the patterned circuit layer having a plurality of circuits and a plurality of first electrical connection terminals; a first dielectric layer disposed on the surfaces of the carrier layer and the patterned circuit layer and having a plurality of first vias for exposing surfaces of the first electrical connection terminals; a second dielectric layer disposed on the first dielectric layer and defined with a plurality of small-dimension opening areas and at least a large-dimension opening area, allowing a portion of the first dielectric layer to be exposed from the opening areas and a portion of the opening areas to correspond in position to the first vias, wherein a plurality of dielectric pillars are disposed on the first dielectric layer exposed from the large-dimension opening area; and a first circuit layer, which comprises first conductive vias disposed in the first vias and electrically connected to the first electrical connection terminals, first circuits disposed on the first dielectric layer exposed from the small-dimension opening areas, and at least a conductive block disposed on the first dielectric layer exposed from the large-dimension opening area.

The carrier layer is a core board or a dielectric layer of a multi-layer packaging substrate.

The top surfaces of the dielectric pillars are embedded in the conductive block or exposed from the conductive block.

The dielectric pillars are arranged in an array, and top surfaces thereof have one of a rectangular shape, a circular shape and any geometric shape.

The packaging substrate structure further comprises a circuit built-up structure disposed on the surfaces of the carrier layer and the first circuit layer, wherein the circuit built-up structure comprises at least a built-up dielectric layer, at least a second circuit layer, and a plurality of second conductive vias electrically connecting the second circuit layer and the first circuit layer.

Further, a solder mask layer is disposed on the circuit built-up structure and formed with a plurality of openings, allowing a portion of the outermost second circuit layer of the circuit built-up structure to be exposed from the openings and thereby serve as electrical connection terminals.

Since the large-dimension first circuit layer has a plurality of dielectric pillars, the difference of the electric current density distribution between the large-dimension opening area and the small-dimension opening areas during electroplating can be reduced so as to prevent insufficient thickness or a hollow center of the conductive block that results in an uneven thickness of the circuit layer, thereby facilitating via processing in a subsequent circuit built-up process and preventing poor electrical connection and poor impedance control.

BRIEF DESCRIPTION OF DRAWINGS

FIG. 1F' is a perspective cross-sectional view of FIG. 1F;

FIG. 2E' is a perspective cross-sectional view of FIG. 2E;

FIG. 3C' is a perspective cross-sectional view of FIG. 3C.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification.

First Embodiment

FIGS. 2A to 2F are views showing a manufacturing method of a packaging substrate structure according to a first embodiment of the present invention.

Figure 1A:
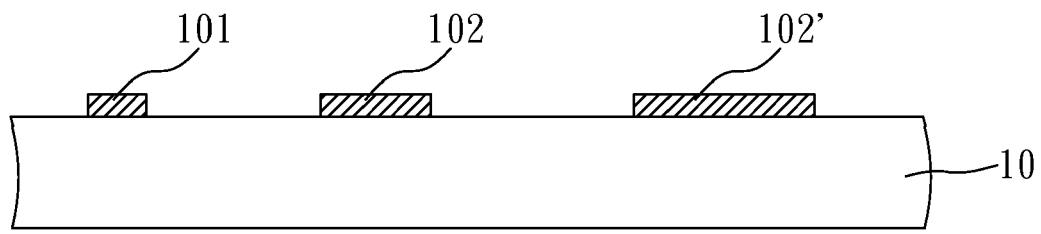
FIGS. 1A to 1F are cross-sectional views showing a manufacturing method of a conventional packaging substrate.
Figure 1B:
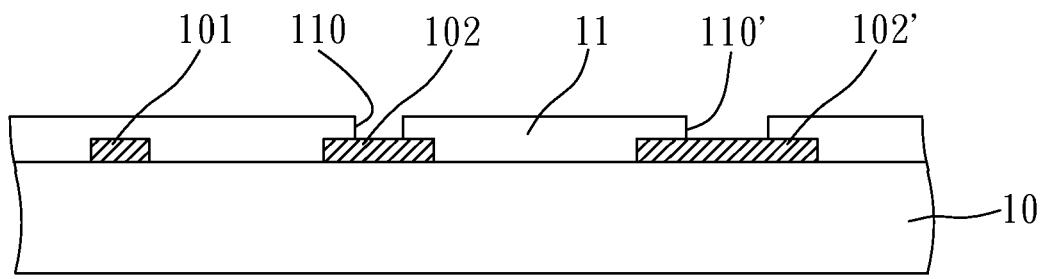
Figure 1C:
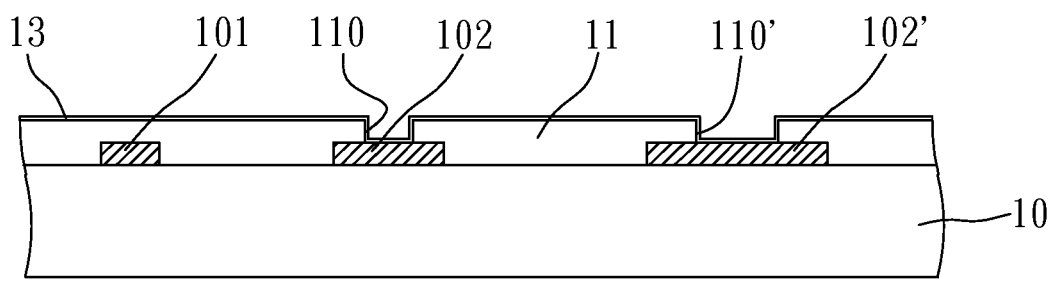
Figure 1D:
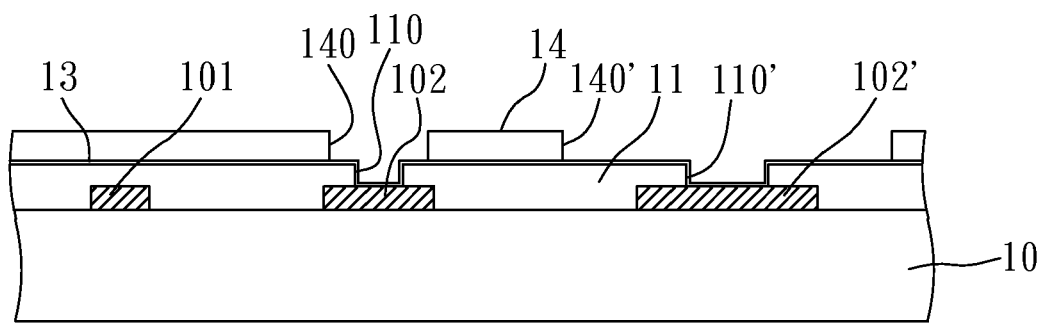
Figure 1E:
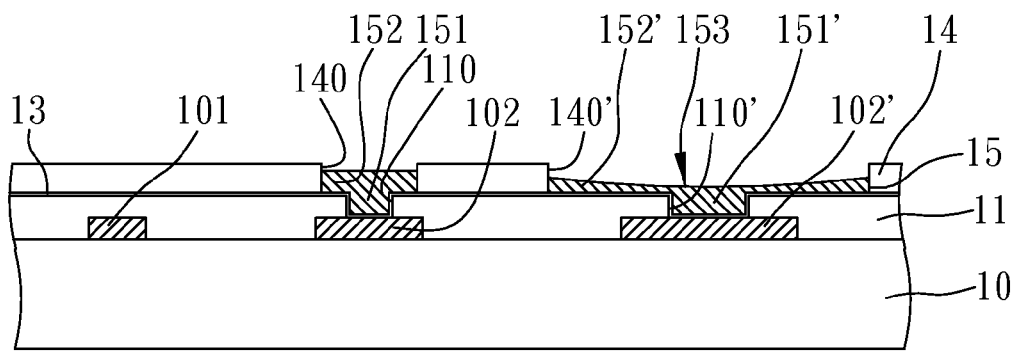
Figure 1F:
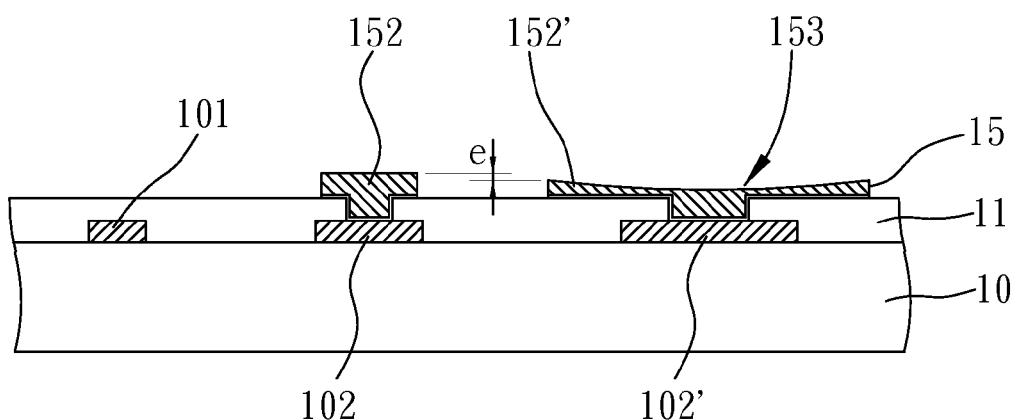
Figure 1F:
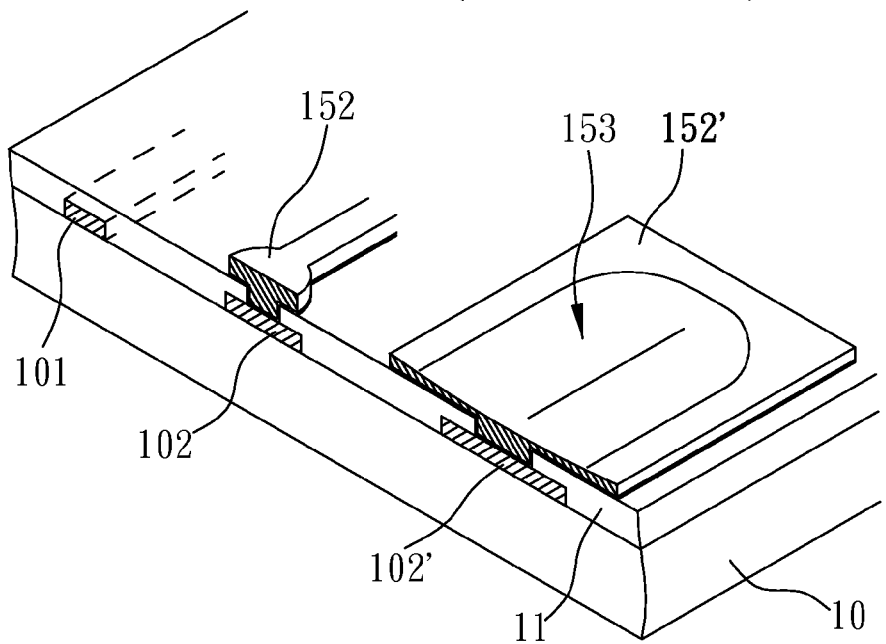
Figure 2A:
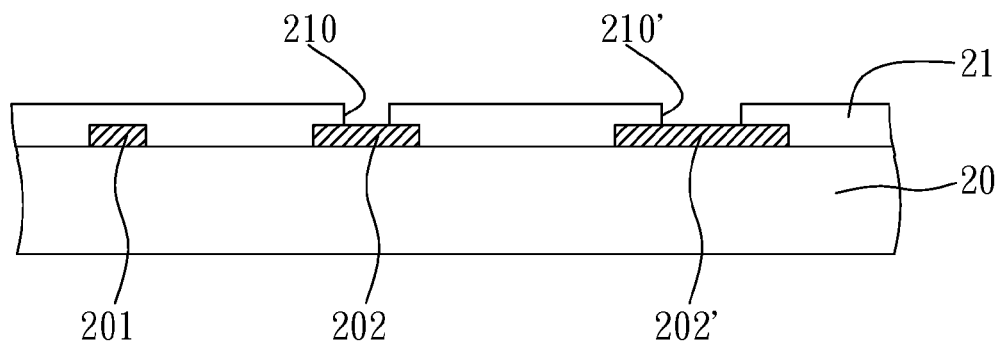
FIGS. 2A to 2F are cross-sectional views showing a manufacturing method of a packaging substrate according to a first embodiment of the present invention.

As shown in FIG. 2A, a carrier layer 20 is provided, and a patterned circuit layer is disposed on at least a surface of the carrier layer 20, wherein the patterned circuit layer has a plurality of circuits 201 and first electrical connection terminals 202, 202'. The carrier layer 20 is one of a core board and a dielectric layer of a multi-layer packaging substrate. At least a first dielectric layer 21 is formed on the patterned circuit layers 201, 202, 202' and at least a surface of the carrier layer 20. A plurality of first vias 210, 210' are formed in the first dielectric layer 21, allowing surfaces of the first electrical connection terminals 202, 202' to be exposed from the first vias 210, 210'.

Figure 2B:
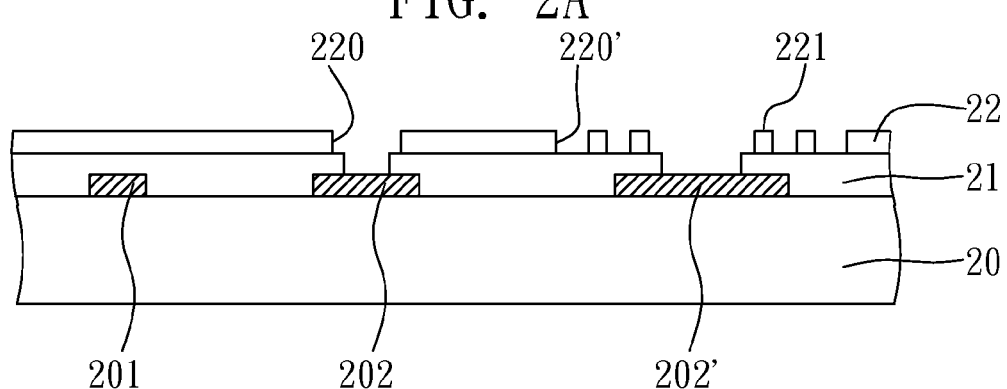

As shown in FIG. 2B, a second dielectric layer 22 is formed on the first dielectric layer 21. A plurality of small-dimension opening areas 220 and at least a large-dimension opening area 220' are defined in the second dielectric layer 22, allowing a portion of the first dielectric layer 21 to be exposed from the opening areas 220, 220' and a portion of the opening areas 220, 220' to correspond in position to the first vias 210, 210'. A plurality of dielectric pillars 221 are formed on the first dielectric layer 21 exposed from the large-dimension opening area 220'.

Figure 2C:
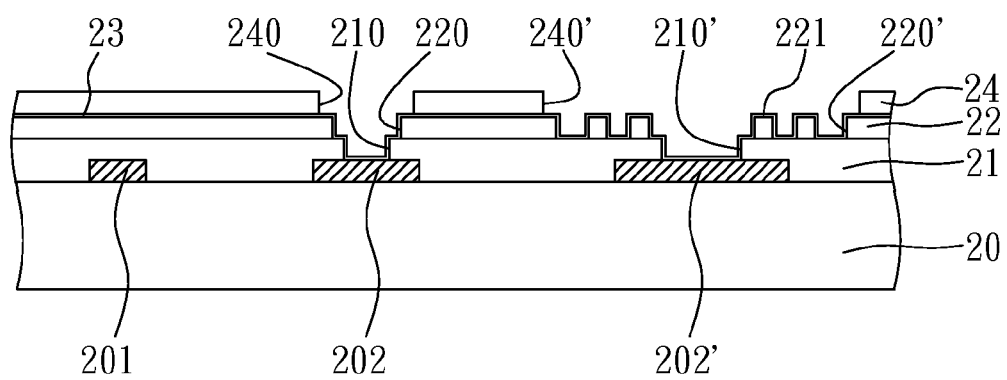

As shown in FIG. 2C, a conductive seed layer 23 is formed on the second dielectric layer 22, in the opening areas 220, 220', in the first vias 210, 210' of the first dielectric layer 21, and on the surfaces of the first electrical connection terminals 202, 202' exposed from the first vias 210, 210'. A resist layer 24 is formed on the conductive seed layer 23. Opening areas 240, 240' are defined in the resist layer 24. A portion of the conductive seed layer 23 is exposed from the opening areas 240, 240' defined in the resist layer 24. The opening areas 240, 240' defined in the resist layer 24 correspond in position to the opening areas 220, 220' defined in the second dielectric layer 22 respectively.

Figure 2D:
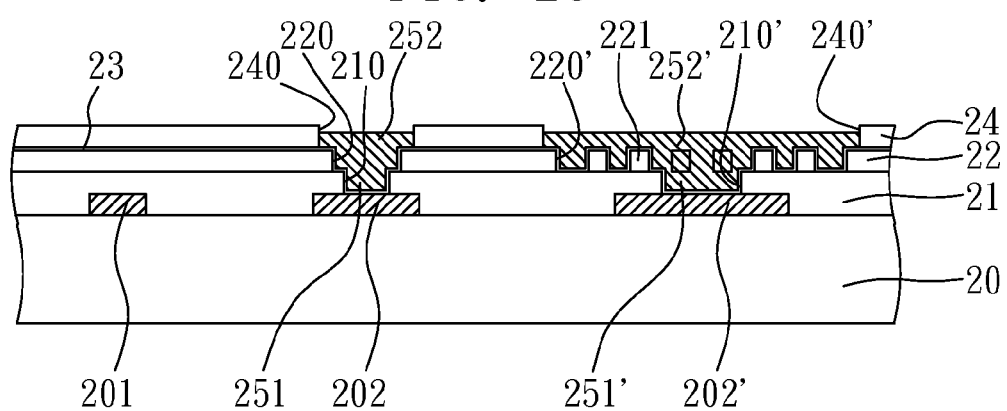

As shown in FIG. 2D, a first circuit layer 25 is formed by electroplating. The first circuit layer 25 comprises: first conductive vias 251, 251' formed in the first vias 210, 210' and electrically connecting to the first electrical connection terminals 202, 202'; first circuits 252 formed on the surface of the first dielectric layer 21 exposed from the small-dimension opening areas 220; and at least a conductive block 252' formed on the first dielectric layer 21 exposed from the large-dimension opening area 220'. The top surface of the dielectric pillars 221 is embedded in the conductive block 252'.

Figure 2E:
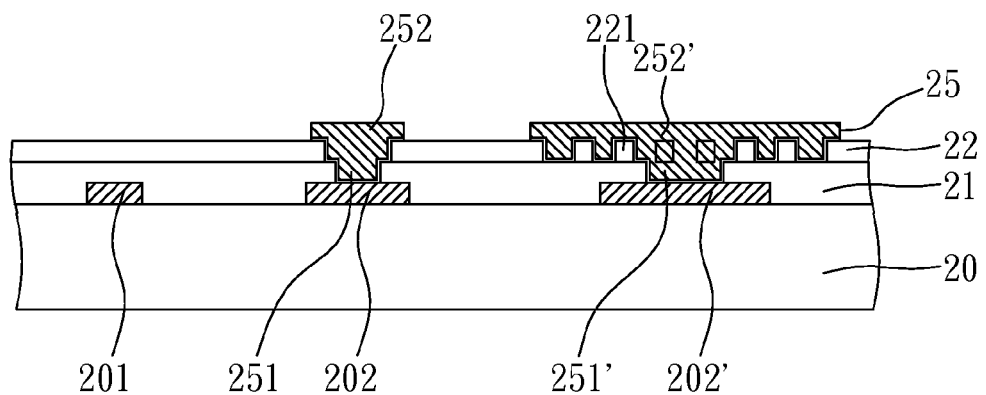
Figure 2E:
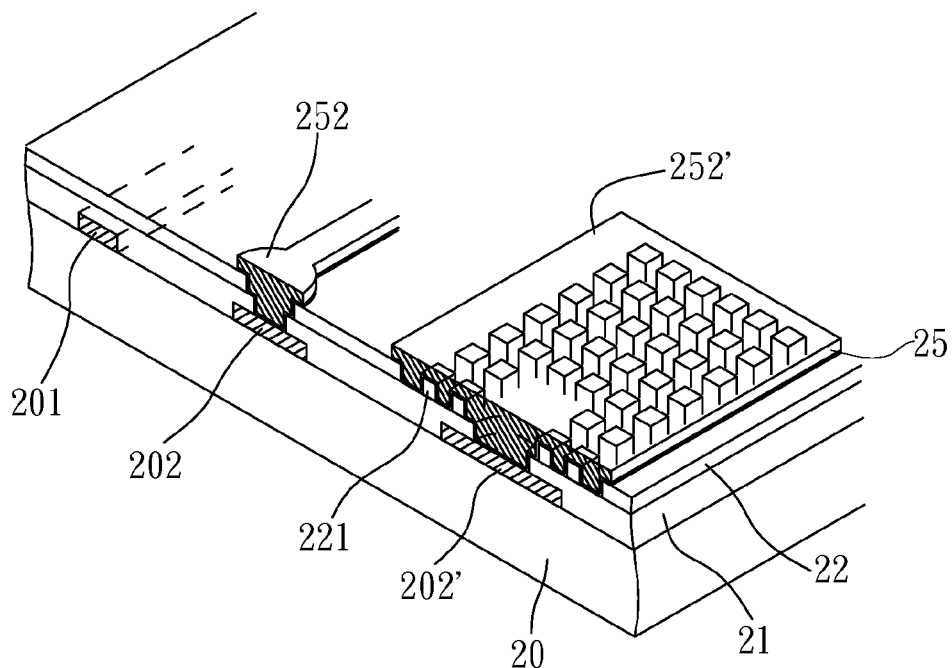

As shown in FIGS. 2E and 2E', the resist layer 24 and the conductive seed layer 23 covered by the resist layer 24 are removed to expose the first circuit layer 25.

Figure 2F:
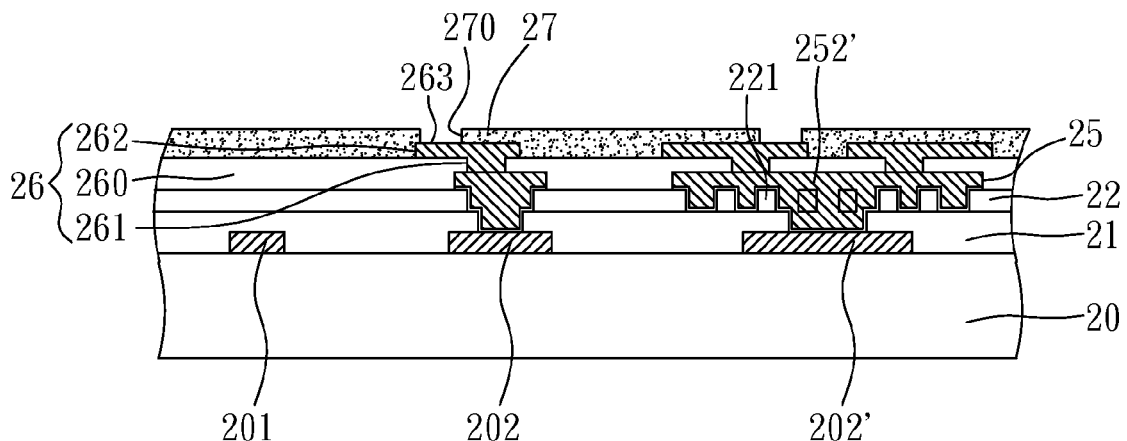

As shown in FIG. 2F, a circuit built-up structure 26 is formed on the surfaces of the second dielectric layer 22 and the first circuit layer 25. As the manufacturing method of the circuit built-up structure is well known in the art, detailed description thereof is omitted. The circuit built-up structure 26 comprises at least a built-up dielectric layer 260, a second circuit layer 262 stacked on the dielectric layer 260, and a plurality of second conductive vias 261 formed in the dielectric layer 260, wherein the second conductive vias 261 are electrically connecting the second circuit layer 262 and the first circuit layer 25. Further, the outermost second circuit layer 262 has a plurality of second electrical connection terminals 263.

Furthermore, a solder mask layer 27 is formed on the circuit built-up structure 26, and a plurality of openings 270 are formed in the solder mask layer 27, thereby allowing the second electrical connection terminals 263 of the circuit built-up structure 26 to be exposed from the openings 270.

Since a plurality of dielectric pillars 221 are formed in the opening areas 220' of the second dielectric layer 22, when the first circuit layer 25 is formed in the large-dimension opening area 220' by electroplating, the difference of the electric current density distribution between the large-dimension opening area 220' and the small-dimension opening areas 220 can be reduced so as to prevent insufficient thickness or a hollow center of the conductive block 252'. Thus, the conductive block 252' of the first circuit layer 25 can have an even surface, which facilitates electrical connection between the second conductive vias 261 of the circuit built-up structure 26 and the conductive block 252' and accordingly prevents poor electrical connection problem.

Second Embodiment

FIGS. 3A to 3D are cross-sectional views showing a manufacturing method of a packaging substrate structure according to a second embodiment of the present invention. The second embodiment is different from the first embodiment in that the first and second circuit layers of the second embodiment are formed through a full additive process.

Figure 3A:
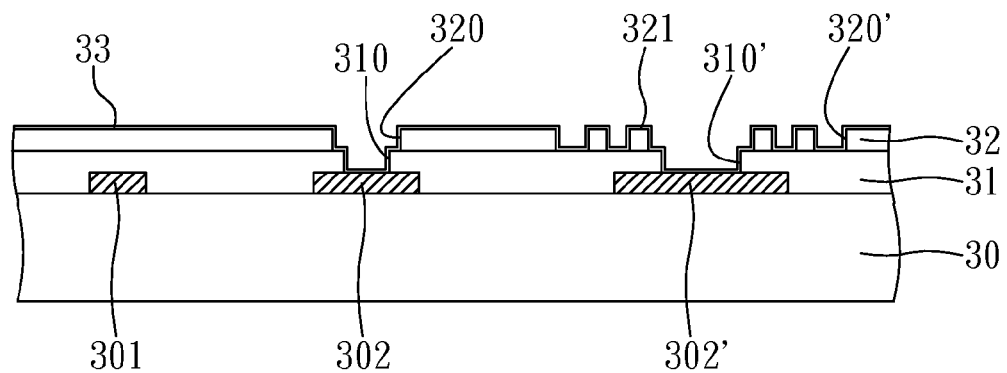
FIGS. 3A to 3D are cross-sectional views showing a manufacturing method of a packaging substrate according to a second embodiment of the present invention.

As shown in FIG. 3A, a structure similar to that of FIG. 2B is shown. A patterned circuit layer is disposed on the surface of a carrier layer 30. The patterned circuit layer comprises a plurality of circuits 301 and first electrical connection terminals 302, 302'. The carrier layer 30 is one of a core board and a dielectric layer of a multi-layer packaging substrate. A first dielectric layer 31 is formed on the surfaces of the carrier layer 30 and the patterned circuit layers 301, 302, 302'. A plurality of first vias 310, 310' are formed in the first dielectric layer 31 to expose a portion of the first electrical connection terminals 302, 302'. A second dielectric layer 32 is formed on the first dielectric layer 31. A plurality of small-dimension opening areas 320 and at least a large-dimension opening area 320' are defined in the second dielectric layer 32. A portion of the first dielectric layer 31 is exposed from the opening areas 320, 320'. A portion of the opening areas 320, 320' correspond in position to the first vias 310, 310'. A plurality of dielectric pillars 321 are formed on the first dielectric layer 31 exposed from the large-dimension opening area 320'. A conductive seed layer 33 is formed on the second dielectric layer 32, in the opening areas 320, 320', in the first vias 310, 310' of the first dielectric layer 31, and on the surfaces of the first electrical connection terminals 302, 302' exposed from the first vias 310, 310'.

Figure 3B:
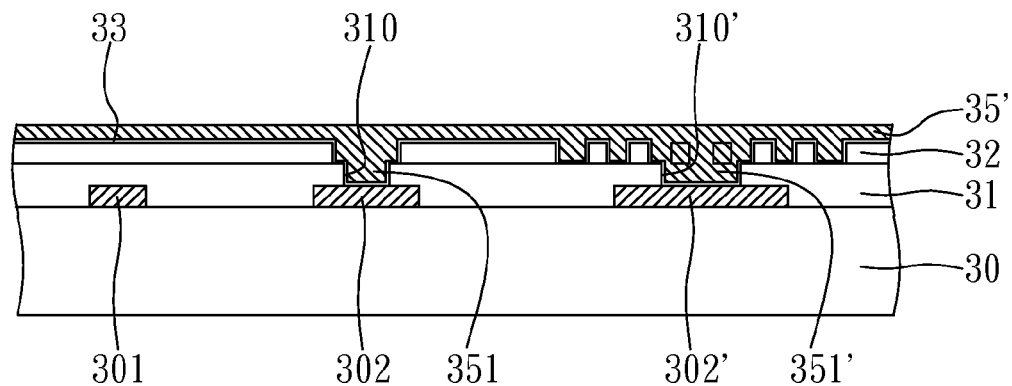

Referring to FIG. 3B, a metal layer 35' is formed on the conductive seed layer 33 by electroplating.

Figure 3C:
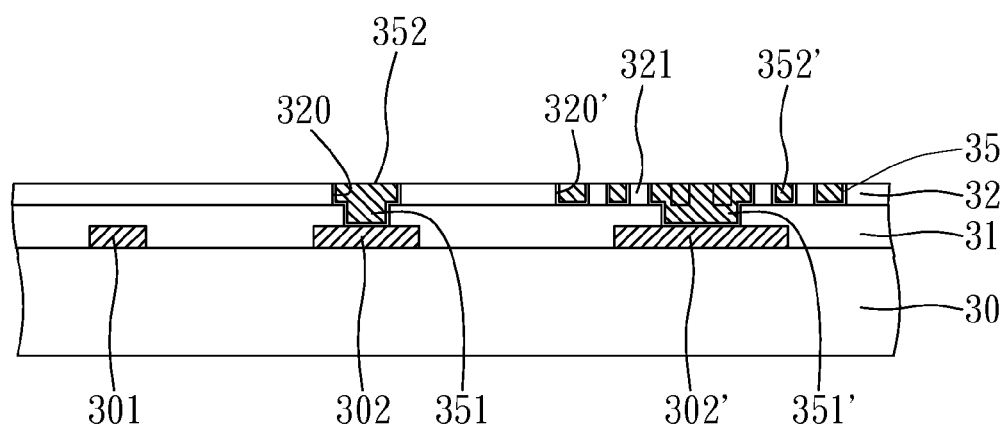
Figure 3C:
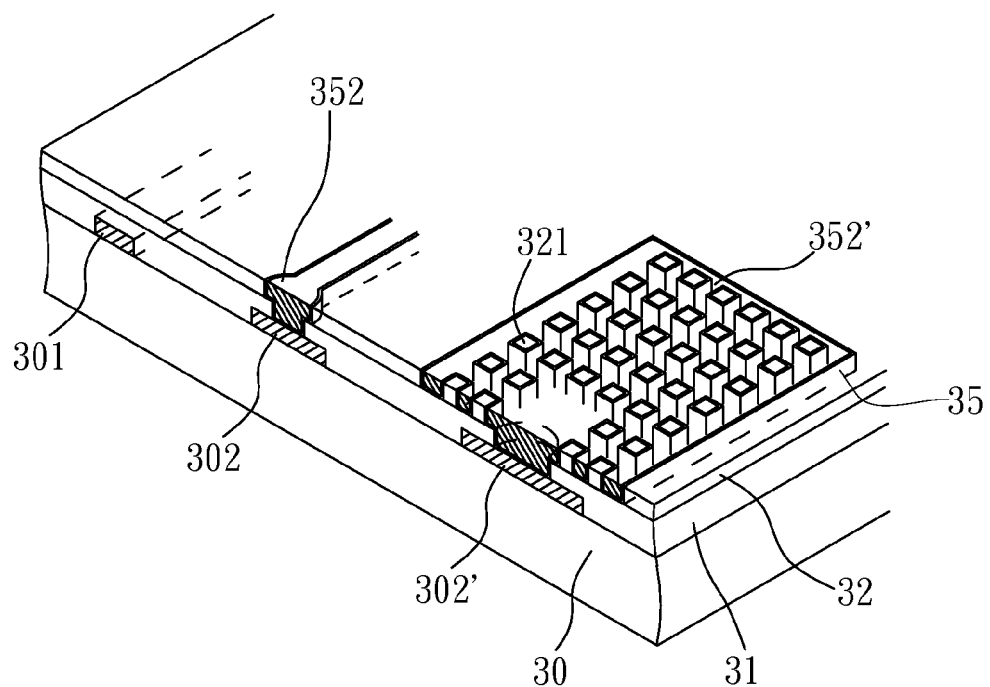

Referring to FIGS. 3C and 3C', the conductive seed layer 33 and the metal layer 35' thereon are removed from the second dielectric layer 32 so as to form a first circuit layer 35, wherein the first circuit layer 35 comprises: first conductive vias 351, 351' formed in the first vias 310, 310' and electrically connecting to the first electrical connection terminals 302, 302'; first circuits 352 formed on the surface of the first dielectric layer 31 exposed from the small-dimension opening areas 320; and a conductive block 352' formed on the first dielectric layer 31 exposed from the large-dimension opening area 320'. The top surfaces of the dielectric pillars 321 are exposed from the conductive block 352'.

Figure 3D:
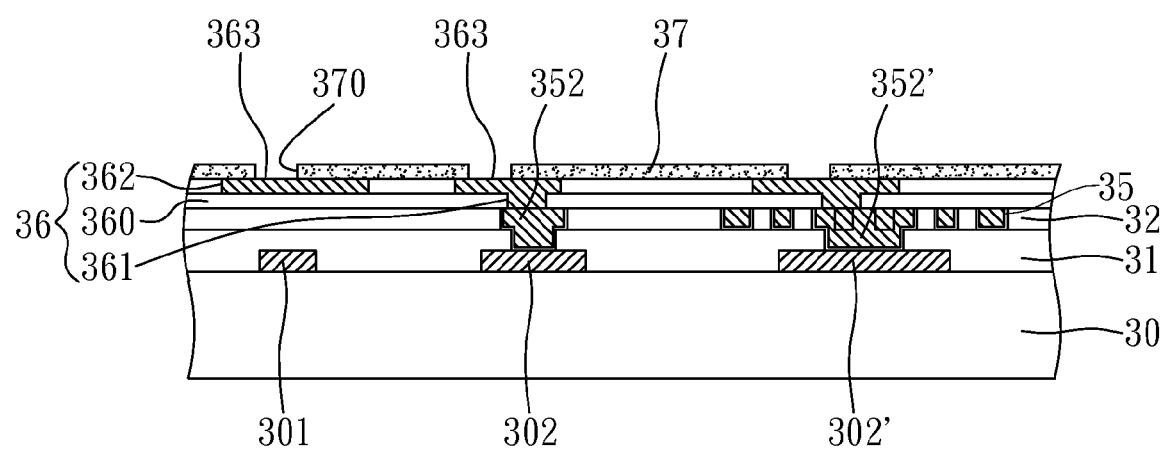

Referring to FIG. 3D, a circuit built-up structure 36 is formed on the surfaces of the second dielectric layer 32 and the first circuit layer 35. As the manufacturing method of the circuit built-up structure is well known in the art, detailed description thereof is omitted. The circuit built-up structure 36 comprises at least a built-up dielectric layer 360; at least a second circuit layer 362, and a plurality of second conductive vias 361, wherein the second conductive vias 361 are electrically connecting the second circuit layer 362 and the first circuit layer 35. Further, the outermost second circuit layer 362 has a plurality of second electrical connection terminals 363.

A solder mask layer 37 is further formed on the circuit built-up structure 36, and a plurality of openings 370 are formed in the solder mask layer 37, thereby allowing the second electrical connection terminals 363 of the circuit built-up structure 36 to be exposed from the openings 370.

Similarly, in the second embodiment, since a plurality of dielectric pillars 321 are formed in the large-dimension opening area 320' of the second dielectric layer 32, when the first circuit layer 35 is formed in the large-dimension opening area 320' by electroplating, the difference of the electrical current density distribution between the large-dimension opening area 320' and the small-dimension opening areas 320 can be reduced so as to prevent insufficient thickness or a hollow center of the conductive block 352'. Thus, the conductive block 352' of the first circuit layer 35 can have an even surface so as to facilitate electrical connection between the second conductive vias 361 of the circuit built-up structure 36 and the conductive block 352', thereby preventing poor electrical connection.

Structural Embodiment

The present invention further provides a packaging substrate structure. Referring to FIGS. 2E and 3C, the packaging substrate structure comprises: a carrier layer 20, 30 with a patterned circuit layer disposed on at least a surface thereof, the patterned circuit layer having a plurality of circuits 201, 301 and a plurality of electrical connection terminals 202, 202', 302, 302'; at least a first dielectric layer 21, 31 disposed on the patterned circuit layer and the at least a surface of the carrier layer 20, 30 and formed with a plurality of first vias 210, 210', 310, 310' for exposing surfaces of the first electrical connection terminals 202, 202', 302, 302'; a second dielectric layer 22, 32 disposed on the first dielectric layer 21, 31 and defined with a plurality of small-dimension opening areas 220, 320 and at least a large-dimension opening area 220', 320', allowing a portion of the first dielectric layer 21, 31 to be exposed from the opening areas 220, 320, 220', 320' and a portion of the opening areas 220, 320, 220', 320' to correspond in position to the first vias 210, 210', 310, 310', wherein a plurality of dielectric pillars 221, 321 are disposed on the first dielectric layer 21, 31 exposed from the large-dimension opening area 220', 320'; and a first circuit layer 25, 35 comprising first conductive vias 251, 351, 251', 351' disposed in the first vias 210, 210', 310, 310' and electrically connected to the first electrical connection terminals 202, 202', 302, 302', first circuits 252, 352 formed on the first dielectric layer 21, 31 exposed from the small-dimension opening areas 220, 320, and at least a conductive block 252', 352' disposed on the first dielectric layer 21, 31 exposed from the large-dimension opening area 220', 320'.

The carrier layer 20, 30 is one of a core board and a dielectric layer of a multi-layer packaging substrate.

The top surfaces of the dielectric pillars 221, 321 are embedded in the conductive block 252' (as shown in FIG. 2E) or exposed from the conductive block 352' (as shown in FIG. 3C).

The dielectric pillars 221, 321 are arranged in an array. The top surfaces of the dielectric pillars 221, 321 have a rectangular shape, a circular shape (not shown), or any geometric shape (not shown).

A circuit built-up structure 26, 36 is further disposed on the surfaces of the carrier layer 21, 31 and the first circuit layer 25, 35. The circuit built-up structure 26, 36 comprises at least a built-up dielectric layer 260, 360, at least a second circuit layer 262, 362, and a plurality of second conductive vias 261, 361 electrically connecting the second circuit layer 262, 362 and the first circuit layer 25, 35.

A solder mask layer 27, 37 is further formed on the circuit built-up structure 26, 36. A plurality of openings 270, 370 are formed in the solder mask layer 27, 37, allowing a portion of the outermost second circuit layer 262, 362 of the circuit built-up structure 26, 36 to be exposed from the openings 270, 370 and thereby serve as electrical connection terminals 263, 363.

The above descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A packaging substrate structure, comprising:
   a carrier layer with a patterned circuit layer disposed on at least a surface thereof, the patterned circuit layer having a plurality of circuits and a plurality of first electrical connection terminals;
   at least a first dielectric layer disposed on the patterned circuit layer and the at least a surface of the carrier layer and formed with a plurality of first vias for exposing surfaces of the first electrical connection terminals;
   a second dielectric layer disposed on the first dielectric layer and defined with a plurality of small-dimension opening areas and at least a large-dimension opening area, allowing a portion of the first dielectric layer to be exposed from the opening areas and a portion of the opening areas to correspond in position to the first vias, wherein a plurality of dielectric pillars are disposed on the first dielectric layer exposed from the large-dimension opening area; and
   a first circuit layer comprising first conductive vias formed in the first vias and electrically connected to the first electrical connection terminals, first circuits formed on the first dielectric layer exposed from the small-dimension opening areas, and at least a conductive block disposed on the first dielectric layer exposed from the large-dimension opening area.

2. The packaging substrate structure of claim 1, wherein the carrier layer is one of a core board and a dielectric layer of a multi-layer packaging substrate.

3. The packaging substrate structure of claim 1, wherein the top surfaces of the dielectric pillars are embedded in the conductive block or exposed from the conductive block.

4. The packaging substrate structure of claim 1, wherein the dielectric pillars are arranged in an array, and top surfaces of the dielectric pillars have one of a rectangular shape, and a circular shape.

5. The packaging substrate structure of claim 1, further comprising a circuit built-up structure disposed on at least a surface of the carrier layer and the first circuit layer, wherein the circuit built-up structure comprises at least a built-up dielectric layer, at least a second circuit layer, and a plurality of second conductive vias electrically connecting the second circuit layer and the first circuit layer.

6. The packaging substrate structure of claim 5, further comprising a solder mask layer disposed on the circuit built-up structure and formed with a plurality of openings, allowing a portion of the second circuit layer of the circuit built-up structure to be exposed from the openings and serve as electrical connection terminals.

7. A manufacturing method of a packaging substrate structure, comprising:
- providing a carrier layer with a patterned circuit layer disposed on at least a surface thereof, the patterned circuit layer having a plurality of circuits and a plurality of first electrical connection terminals;
- forming at least a first dielectric layer on the patterned circuit layer and the at least a surface of the carrier layer and formed with a plurality of first vias in the first dielectric layer to expose surfaces of the first electrical connection terminals;
- forming a second dielectric layer on the first dielectric layer, defining a plurality of small-dimension opening areas and at least a large-dimension opening area in the second dielectric layer, allowing a portion of the first dielectric layer to be exposed from the opening areas and a portion of the opening areas to correspond in position to the first vias, wherein a plurality of dielectric pillars are formed on the first dielectric layer exposed from the large-dimension opening area;
- forming a conductive seed layer on the second dielectric layer, in the opening areas thereof, in the first vias of the first dielectric layer, and on the surfaces of the first electrical connection terminals exposed from the first vias;
- forming a resist layer on the conductive seed layer, forming opening areas in the resist layer, allowing a portion of the conductive seed layer to be exposed from the opening areas and the opening areas in the resist layer to correspond in position to the opening areas in the second dielectric layer;
- forming, by electroplating, a first circuit layer comprising first conductive vias formed in the first vias and electrically connected to the first electrical connection terminals, first circuits formed on the first dielectric layer exposed from the small-dimension opening areas, and at least a conductive block formed on the first dielectric layer exposed from the large-dimension opening area, allowing top surfaces of the dielectric pillars to be embedded in the conductive block; and
- removing the resist layer and the conductive seed layer covered thereby.

8. The manufacturing method of claim 7, wherein the carrier layer is one of a core board and a dielectric layer of a multi-layer packaging substrate.

9. The manufacturing method of claim 7, further comprising forming a circuit built-up structure on the surfaces of the second dielectric layer and the first circuit layer, wherein the circuit built-up structure comprises at least a built-up dielectric layer, at least a second circuit layer, and a plurality of second conductive vias electrically connecting the second circuit layer and the first circuit layer, a portion of the second circuit layer having a plurality of second electrical connection terminals.

10. The manufacturing method of claim 9, further comprising forming a solder mask layer on the circuit built-up structure, forming a plurality of openings in the solder mask layer, and allowing the second electrical connection terminals of the circuit built-up structure to be exposed from the openings.

11. A manufacturing method of a packaging substrate structure, comprising:
- providing a carrier layer with a patterned circuit layer disposed on at least a surface thereof, the patterned circuit layer having a plurality of circuits and a plurality of first electrical connection terminals;
- forming at least a first dielectric layer on the patterned circuit layer and the at least a surface of the carrier layer, forming a plurality of first vias in the first dielectric layer to expose surfaces of the first electrical connection terminals;
- forming a second dielectric layer on the first dielectric layer, defining a plurality of small-dimension opening areas and at least a large-dimension opening area in the second dielectric layer, allowing a portion of the first dielectric layer to be exposed from the opening areas and a portion of the opening areas to correspond in position to the first vias, wherein a plurality of dielectric pillars are formed on the first dielectric layer exposed from the large-dimension opening area;
- forming a conductive seed layer on the second dielectric layer, in the opening areas thereof, in the first vias of the first dielectric layer, and on surfaces of the first electrical connection terminals exposed from the first vias;
- forming, by electroplating, a metal layer on the conductive seed layer; and
- removing the conductive seed layer and the metal layer thereon from the second dielectric layer so as to form a first circuit layer comprising first conductive vias formed in the first vias and electrically connected to the first electrical connection terminals, first circuits formed on the first dielectric layer exposed from the small-dimension opening areas, and at least a conductive block formed on the first dielectric layer exposed from the large-dimension opening area, allowing top surfaces of the dielectric pillars to be exposed from the conductive block.

12. The manufacturing method of claim 11, wherein the carrier layer is one of a core board and a dielectric layer of a multi-layer packaging substrate.

13. The manufacturing method of claim 11, further comprising forming a circuit built-up structure on the surfaces of the second dielectric layer and the first circuit layer, wherein the circuit built-up structure comprises at least a built-up dielectric layer, at least a second circuit layer, and a plurality of second conductive vias electrically connecting the second circuit layer and the first circuit layer, a portion of the second circuit layer having a plurality of second electrical connection terminals.

14. The manufacturing method of claim 13, further comprising forming a solder mask layer on the circuit built-up structure, forming a plurality of openings in the solder mask layer, and allowing the second electrical connection terminals of the circuit built-up structure to be exposed from the openings.

* * * * *